United States Patent
Sandgren (10) Patent No.: US 9,065,409 B2
(45) Date of Patent: *Jun. 23, 2015

(54) METHOD AND ARRANGEMENT FOR PROCESSING OF AUDIO SIGNALS

(75) Inventor: Niclas Sandgren, Knivsta (SE)

(73) Assignee: TELEFONAKTIEBOLAGET L M ERICSSON (PUBL), Stockholm (SE)

( * ) Notice: Subject to any disclaimer, the term of this patent is extended or adjusted under 35 U.S.C. 154(b) by 345 days.

This patent is subject to a terminal disclaimer.

(21) Appl. No.: 13/071,711

(22) Filed: Mar. 25, 2011

(65) Prior Publication Data

US 2012/0243706 A1    Sep. 27, 2012

(30) Foreign Application Priority Data

Mar. 21, 2011 (WO) .................. PCT/SE2011/050306

(51) Int. Cl.
| | |
|---|---|
| H03G 5/00 | (2006.01) |
| H03G 9/00 | (2006.01) |
| H03G 9/02 | (2006.01) |
| G10L 21/0208 | (2013.01) |
| G10L 25/24 | (2013.01) |

(52) U.S. Cl.
CPC .............. *H03G 9/005* (2013.01); *H03G 9/025* (2013.01); *G10L 21/0208* (2013.01); *G10L 25/24* (2013.01)

(58) Field of Classification Search
CPC ........ H03G 9/005; H03G 9/025; G10L 25/24; G10L 21/0208
See application file for complete search history.

(56) References Cited

U.S. PATENT DOCUMENTS

| | | | | |
|---|---|---|---|---|
| 5,208,866 | A * | 5/1993 | Kato et al. ..................... | 381/107 |
| 5,627,938 | A * | 5/1997 | Johnston ..................... | 704/200.1 |
| 6,459,914 | B1* | 10/2002 | Gustafsson et al. .......... | 455/570 |
| 8,249,270 | B2* | 8/2012 | Matsuo ......................... | 381/94.1 |
| 2003/0216909 | A1* | 11/2003 | Davis et al. ................... | 704/210 |
| 2005/0091040 | A1* | 4/2005 | Nam et al. .................... | 704/201 |

(Continued)

FOREIGN PATENT DOCUMENTS

| | | |
|---|---|---|
| EP | 2209117 A1 | 7/2010 |
| JP | 2006-243178 A | 9/2006 |

(Continued)

OTHER PUBLICATIONS

Welch, Peter D., "The use of fast Fourier transform for the estimation of power spectra: A method based on time averaging over short, modified periodograms," Published in: Audio and Electroacoustics, IEEE Transactions on, vol. 15, No. 2, Jun. 1967, pp. 70,73.*

(Continued)

*Primary Examiner* — Duc Nguyen
*Assistant Examiner* — Taunya McCarty
(74) *Attorney, Agent, or Firm* — Rothwell, Figg, Ernst & Manbeck, P.C.

(57) ABSTRACT

Method and arrangement in an audio handling entity, for damping of dominant frequencies in a time segment of an audio signal. A time segment of an audio signal is obtained, and an estimate of the spectral density or "spectrum" of the time segment is derived. An approximation of the estimate is derived by smoothing the estimate, and a frequency mask is derived by inverting the approximation. Frequencies comprised in the audio time segment are then damped based on the frequency mask. The method and arrangement involves no multi-band filtering or selection of attack and release times.

23 Claims, 5 Drawing Sheets

(56) References Cited

U.S. PATENT DOCUMENTS

| | | | |
|---|---|---|---|
| 2006/0259300 A1 | 11/2006 | Winsvold | |
| 2008/0069364 A1* | 3/2008 | Itou et al. | 381/17 |
| 2009/0210224 A1 | 8/2009 | Fukuda et al. | |
| 2010/0042407 A1* | 2/2010 | Crockett | 704/200.1 |
| 2010/0182510 A1 | 7/2010 | Gerkmann et al. | |
| 2011/0045781 A1* | 2/2011 | Shellhammer et al. | 455/67.11 |

FOREIGN PATENT DOCUMENTS

| | | | |
|---|---|---|---|
| JP | 2007-243856 A | 9/2007 | |
| WO | WO 2009074476 A1 * | 6/2009 | |
| WO | WO 2010027509 A1 * | 3/2010 | |

OTHER PUBLICATIONS

Komninakis, C., "A fast and accurate Rayleigh fading simulator," Global Telecommunications Conference, 2003. GLOBECOM '03. IEEE, vol. 6, No., pp. 3306,3310 vol. 6, Dec. 1-5, 2003.*

Stoica, P. et al., "Smoothed Nonparametric Spectral Estimation via Cepsturm Thresholding—Introduction of a Method for Smoothed Nonparametric Spectral Estimation", IEEE Signal Processing Magazine, Nov. 1, 2006, vol. 23, nr. 6, pp. 34-45, ISSN 1053-5888.

Stoica, P., et al. "Total-Variance Reduction Via Thresholding: Application to Cepstral Analysis", IEEE Transactions on Signal Processing, Jan. 1, 2007, vol. 55, nr. 1, pp. 66-72, ISSN 1053-587X.

Weisser, A., "A Novel Envelope-Based Generic Dynamic Range Compression Model", Convention Paper 8020, AES Convention 128, May 2010, 14 pages.

International Search Report and Written Opinion issued in International application No. PCT/SE2011/050306 on Dec. 27, 2011, 10 pages.

Extended European Search Report dated Jul. 30, 2014, issued in European Patent Application No. 11861333.0, 5 pages.

Office Action issued by the Japanese Patent Office in corresponding application 2014-501033 dated Oct. 7, 2014, 2 pages.

* cited by examiner

METHOD AND ARRANGEMENT FOR PROCESSING OF AUDIO SIGNALS

TECHNICAL FIELD

The invention relates to processing of audio signals, in particular to a method and an arrangement for damping of dominant frequencies in an audio signal.

BACKGROUND

In audio communication, where a speech source is captured at a certain venue through a microphone, the variation in obtained signal level (amplitude) can be significant. The variation may be related to several factors including the distance between the speech source and the microphone, the variation in loudness and pitch of the voice and the impact of the surrounding environment. When the captured audio signal is digitalized, significant variations or fluctuations in signal level can result in signal overload and clipping effects. Such deficiencies may result in that adequate post-processing of the captured audio signal becomes unattainable and, in addition, spurious data overloads can result in an unpleasant listening experience at the audio rendering venue.

A common way to reduce these deficiencies or drawbacks is to employ compression of the captured signal, which reduces the dynamic range so that a more compact amplitude representation of the signal of interest is obtained. A typical compressor uses a pre-defined threshold to select which signal amplitudes that require attention. For the considered case of downward compression, signal levels above the pre-defined threshold are reduced by a pre-set damping factor or ratio.

Dynamic Range Compression (DRC) can be performed in several ways involving different levels of mathematics. The damping factor is usually a fixed value, but its effect is generally smoothed by "fade in" (attack) and "fade out" (release) time intervals, which can be seen as a time variation of the damping. The level of compression can be frequency independent and hence fixed for all frequencies present in the signal, or, it can be dynamically computed for different frequency bands.

Considering the most advanced method of downward DRC with time varying and frequency dependant damping, the computational effort can be significant. In real-time applications, multi-band analysis can be unobtainable if additional speech processing algorithms, such as e.g. Acoustic Echo Cancelling (AEC) or noise removal, are to be performed in conjunction with the compression for full-band signals (24 kHz bandwidth) over short time windows (typically 10 ms), which are common in communications.

Moreover, conventional compression of the amplitude in the time domain introduces artifacts since the signal is modulated in every instance where the amplitude exceeds the pre-defined threshold. Although the audibility of these effects can be limited by careful selection of the attack and release times, the wave characteristics of the sound is still altered. Furthermore, the selection of the user parameters, such as compression ratio, threshold, attack and release times is ambiguous, and thus no trivial task.

SUMMARY

It would be desirable to achieve improved processing of audio signals having a fluctuating signal level, thus avoiding the problems of audio signal processing according to the prior art described above. It is an object of the invention to address at least some of the issues outlined above. Further it is an object of the invention to provide a method and an arrangement for enabling damping of dominant frequencies in an audio signal. These objects may be met by a method and an apparatus according to the attached independent claims. Embodiments are set forth in the dependent claims.

The concept of audio compression is well known and commonly used in practical applications. The main novelties of the suggested technique are that it is based on a non-parametric spectral analysis framework and it covers the entire frequency band in a frequency dependant manner without requiring any multi-band filtering (filter bank). Moreover, this may be done using a solid theoretically sound methodology, with low computational complexity, which produces a robust result.

The suggested technique requires no selection of attack and release time, since there are no abrupt changes in the slope of the amplitude, and hence the characteristic of the audio signal is preserved without any "fade in" or "fade out" of the compression. Yet, the level of compression is allowed to be time varying and fully data dependant as it is computed individually for each signal time frame.

According to a first aspect, a method in an audio handling entity is provided for damping of dominant frequencies in a time segment of an audio signal. The method involves obtaining a time segment of an audio signal and deriving an estimate of the spectral density or "spectrum" of the time segment. An approximation of the estimated spectral density is derived by smoothing the estimate. A frequency mask is derived by inverting the derived approximation, and frequencies comprised in the audio time segment are then damped based on the frequency mask.

According to a second aspect, an arrangement is provided in an audio handling entity for damping of dominant frequencies in a time segment of an audio signal. The arrangement comprises a functional unit adapted to obtain a time segment of an audio signal. The arrangement further comprises a functional unit adapted to derive an estimate of the spectral density of the time segment. The arrangement further comprises a functional unit adapted to derive an approximation of the spectral density estimate by smoothing the estimate, and a functional unit adapted to derive a frequency mask by inverting the approximation. The arrangement further comprises a functional unit adapted to damp frequencies comprised in the audio time segment, based on the frequency mask.

The above method and arrangement may be implemented in different embodiments. In some embodiments, the derived spectral density estimate is a periodogram. In some embodiments, the smoothing involves cepstral analysis, where cepstral coefficients of the spectral density estimate are derived, and where cepstral coefficients having an absolute amplitude value below a certain threshold; or, consecutive cepstral coefficients with index higher than a preset threshold, are removed.

In some embodiments, the frequency mask is configured to have a maximum gain of 1, which entails that no frequencies are amplified when the frequency mask is used. The maximum damping of the frequency mask may be predefined to a certain level, or, the smoothed estimated spectral density may be normalized by the unsmoothed estimated spectral density in the frequency mask. The damping may involve multiplying the frequency mask with the estimated spectral density in the frequency domain, or, configuring a FIR filter based on the frequency mask, for use on the audio signal time segment in the time domain.

The embodiments above have mainly been described in terms of a method. However, the description above is also intended to embrace embodiments of the arrangement, adapted to enable the performance of the above described features. The different features of the exemplary embodiments above may be combined in different ways according to need, requirements or preference.

BRIEF DESCRIPTION OF THE DRAWINGS

The invention will now be described in more detail by means of exemplary embodiments and with reference to the accompanying drawings, in which.

DETAILED DESCRIPTION

Briefly described, amplitude compression is performed at the most dominant frequencies of an audio signal. The most dominant frequencies can be detected by using spectral analysis in the frequency domain. By lowering the gain of, i.e. damping, the dominant frequencies, instead of performing compression when the amplitude of the entire signal increases above a certain threshold, the sine wave characteristics of the sound can be preserved. The added gain (i.e. damping, when the added gain is a value between 0 and 1 for all frequencies) is determined in an automatic data dependant manner.

It is assumed that an audio signal is digitally sampled in time at a certain sampling rate ($f_s$). For post-processing and transmission reasons the sampled signal is divided into time segments or "frames" of length N. The data in one such frame will henceforth be denoted $y_k$ (k=0, 2, . . . , N−1).

Using e.g. Fourier analysis and specifically the Fast Fourier Transform (FFT) it is possible to obtain a spectral density estimate $\phi_p$, such as the periodogram of the data $y_k$ $$\Phi_p = \frac{1}{N}\left|\sum_{k=0}^{N-1} y_k e^{-i\omega_p k}\right|^2 \quad p = 0, \ldots, N-1 \quad (1)$$

where $$\omega_p = \frac{2\pi}{N}p$$

are the Fourier grid points.

Typically, the periodogram of an audio signal has an erratic behavior. This can be seen in FIG. 1, where a periodogram is illustrated in a thin solid line. Using spectral information, such as the periodogram, as prior knowledge of where to perform signal compression is very unintuitive and unwise, since it would attenuate approximately all useful information in the signal.

However, it has now been realized that by using a technique that invokes a significant amount of smoothing, and hence estimating the "baseline" of the spectrum while excluding the details and sharp peaks, as prior information about the location of the dominating frequencies, compression can be performed at these relevant frequencies without introducing disturbing artifacts. For the computation of a smooth estimate of the periodogram, a technique involving cepstrum thresholding has been used, although alternatively other techniques suitable for achieving a smoothed spectral density estimate may be used.

The sequence $$c_k = \frac{1}{N}\sum_{p=0}^{N-1} \ln(\Phi_p)e^{i\omega_k p} + \gamma\delta_{k,0} \quad k = 0, \ldots, N-1 \quad (2)$$

where $$\delta_{k,0} = \begin{cases} 1 & \text{if } k = 0 \\ 0 & \text{else} \end{cases} \quad \gamma = 0.577216 \ldots$$

is well known as the cepstrum or cepstral coefficients related to the signal $y_k$. In addition, it is known that many of the N cepstrum coefficients typically take on small values. Hence, by thresholding or truncating these coefficient to zero in a theoretically sound manner (see [1][2]) it is possible to obtain a smooth estimate of (1) as $$\tilde{\Phi}_p = \alpha\hat{\Phi}_p \quad p = 0, \ldots, N-1 \quad (3)$$

where $$\hat{\Phi}_p = \exp\left[\sum_{k=0}^{N-1} \hat{c}_k e^{-i\omega_p k}\right] \quad p = 0, \ldots, N-1 \quad (4)$$

and where $$\alpha = \frac{\sum_{p=0}^{N-1}\Phi_p\hat{\Phi}_p}{\sum_{p=0}^{N-1}\hat{\Phi}_p^2}$$

is a normalization constant. In (4) the sequence $\hat{c}_k$ corresponds to the thresholded or truncated sequence $c_k$ in (2).

Figure 1:
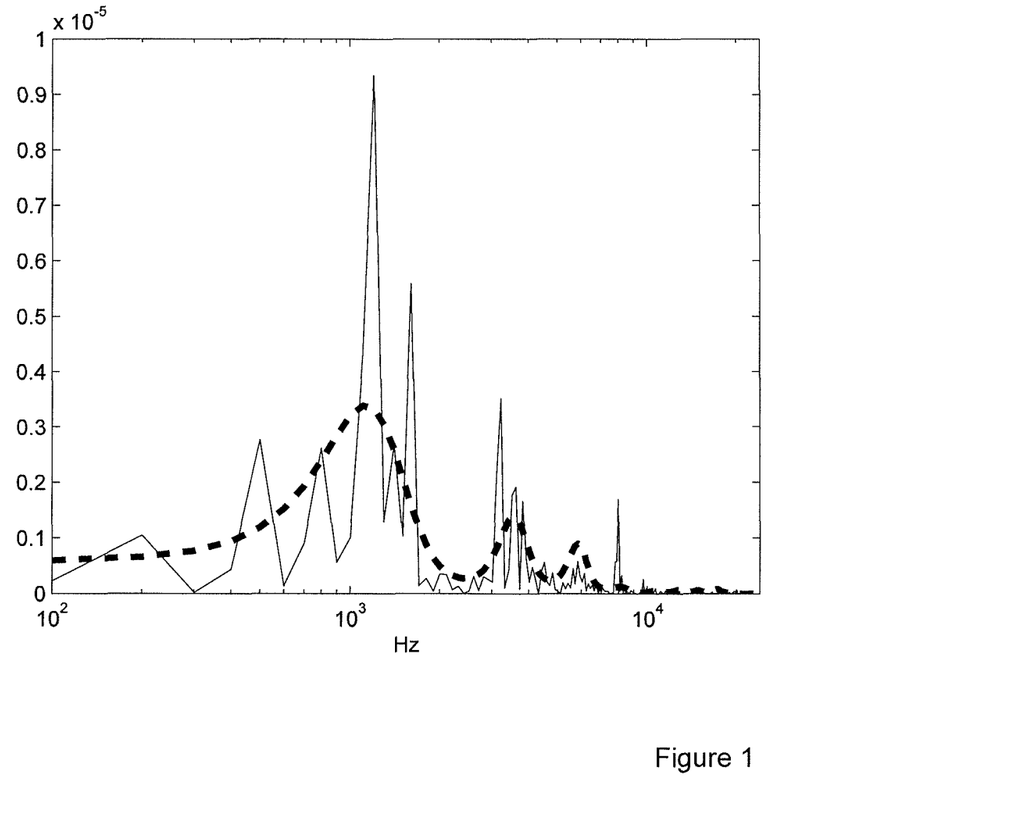
FIG. 1 shows a spectral density estimate (solid line) of an audio signal segment and a smoothed spectral density estimate (dashed line) according to an exemplifying embodiment.

In FIG. 1, which represents (the frequency contents of) a typical 10 ms time frame of a speech signal sampled at 48 kHz, the smoothed spectral density estimate obtained using the cepstrum thresholding algorithm of [1] is shown as a bold dashed line. Evidently, the dashed line is not an accurate estimate of the details of the solid line, which is why it serves the purposes so well. The frequencies with the highest spectral power are roughly estimated, resulting in a "rolling baseline".

The inverse of the smoothed spectral density estimate (dashed line) in FIG. 1 can be used as a frequency mask containing the information of at which frequencies compression is required. If the smoothed spectral density estimate (dashed line) had been an accurate estimate of the spectral density estimate (solid line), i.e. if the smoothing had been non-existent or very limited, using it as a frequency mask for the signal frame would give a very poor and practically useless result.

By letting the frequency mask have a maximum gain value of 1 it may be ensured that no amplification of the signal is performed at any frequency. The minimum gain value of the frequency mask, which corresponds to the maximal damping, can be set either to a pre-set level (5) to ensure that the dominating frequency is "always" damped by a known value. Alternatively, the level of maximal compression or damping can be set in an automatic manner (6) by normalization of the smoothed spectral density estimate using e.g. the maximum value of the unsmoothed spectral density estimate, e.g. the periodogram.

$$F_p = 1 - \lambda \frac{\hat{\Phi}_p}{\max(\hat{\Phi}_p)} \text{ where } 0 < \lambda < 1 \quad (5)$$

$$F_p = 1 - \frac{\hat{\Phi}_p}{\max(\hat{\Phi}_p)} \quad (6)$$

where p=0, 2, . . . , N−1.

Figure 2:
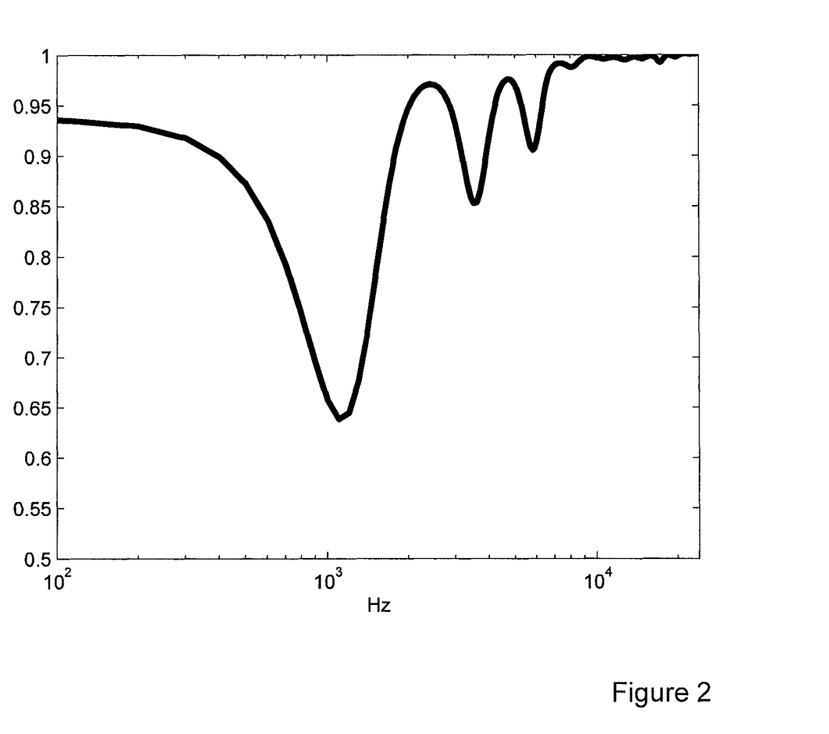
FIG. 2 shows a frequency mask based on a smoothed spectral density estimate, according to an exemplifying embodiment.

FIG. 2 shows the resulting frequency mask for the signal frame considered in FIG. 1 obtained using (6) which is fully automatic, since no parameters need to be selected. The computation of (3) may also be regarded as automatic, even though it may involve a trivial choice of a parameter related to the value of a cepstrum amplitude threshold [1][2], such that a lower parameter value is selected when the spectral density estimate has an erratic behavior, and a higher parameter value is selected when the spectral density estimate has a less erratic behavior. For the case of audio signals, the parameter may be predefined to a constant value.

If the level of compression obtained using (6) is insufficient in a certain scenario it is possible to use (5) and let λ take on a desired value between 0 and 1.

The filter mask is then used either by direct multiplication with the estimated spectral density in the frequency domain to compute a compressed data set $\hat{y}_k$ (k=0, 2, . . . , N−1), or, e.g. as input for the design of a Finite Impulse Response (FIR) filter, which can be applied to $y_k$ in the time domain.

Figure 3:
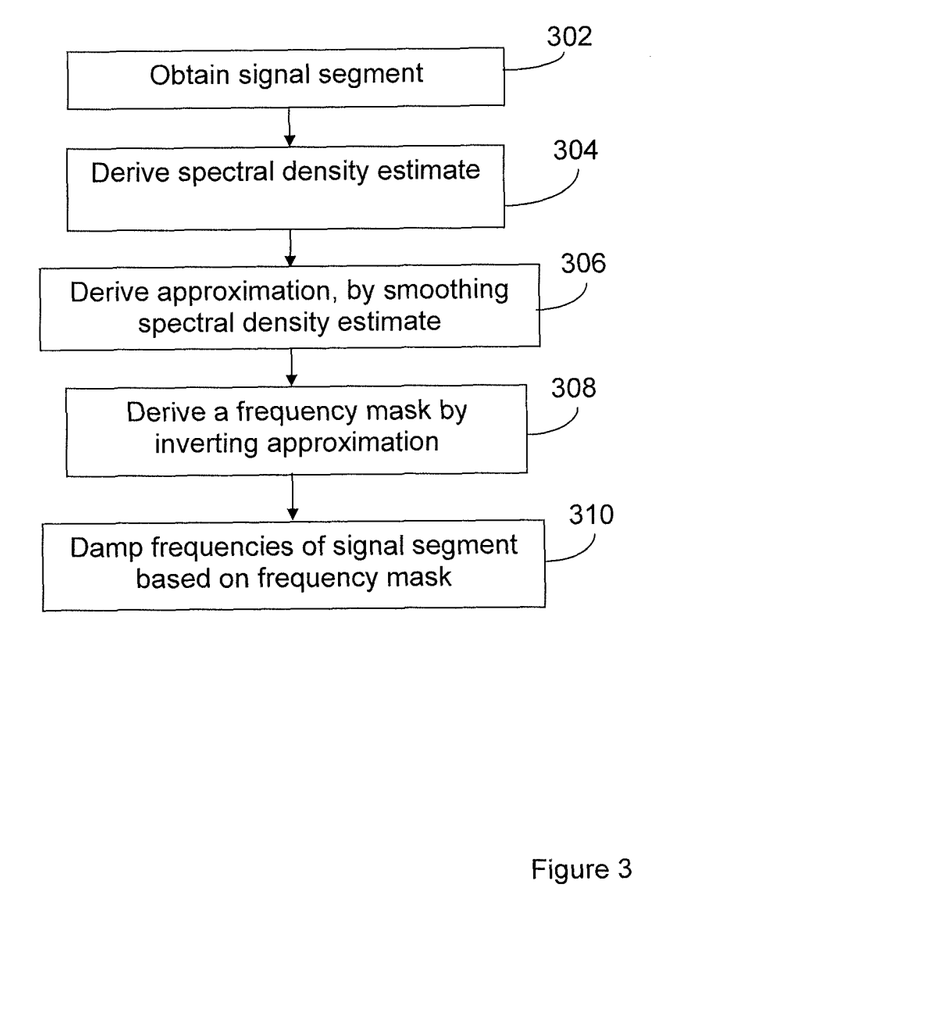
FIG. 3 is a flow chart illustrating a procedure in an audio handling entity, according to an exemplifying embodiment.

Example Procedure FIG. 3

An exemplifying embodiment of the procedure of damping dominant frequencies in a time segment of an audio signal will now be described with reference to FIG. 3. The procedure could be performed in an audio handling entity, such as e.g. a node in a teleconference system and/or a node or terminal in a wireless or wired communication system, a node involved in audio broadcasting, or an entity or device used in music production.

A time segment of an audio signal is obtained in an action 302. The audio signal is assumed to be captured by a microphone or similar and to be sampled with a sampling frequency. The audio signal could comprise e.g. speech produced by one or more speakers taking part in a teleconference or some other type of communication session. The time segment could be e.g. approximately 10 ms or any other length suitable for signal processing.

An estimate (in the frequency domain) of the spectral density of the derived time segment is obtained in an action 304. This estimate could be e.g. a periodogram, and could be derived e.g. by use of a Fourier transform method, Such as the FFT. An approximation of the estimated spectral density is derived in an action 306, by smoothing of the spectral density estimate. The approximation should be rather "rough", i.e. not be very close to the spectral density estimate, which is typically erratic for audio signals, such as e.g. speech or music (cf. FIG. 1). The approximation could be derived e.g. by use of a cepstrum thresholding algorithm, removing (in the cepstrum domain) cepstral coefficients having an absolute amplitude value below a certain threshold, or removing consecutive cepstral coefficients with an index higher than a preset threshold.

A frequency mask is derived from the derived approximation of the spectral density estimate in an action 308, by inverting the derived approximation, i.e. the smoothed spectral density estimate. The frequency mask is then used or applied for damping frequencies comprised in the signal time segment in an action 310. The damping could involve multiplying the frequency mask with the estimated spectral density in the frequency domain, or, a FIR filter could be configured based on the frequency mask, which FIR filter could be used on the audio signal time segment in the time domain.

The frequency mask could be configured in different ways. For example, the maximum gain of the frequency mask could be set to 1, thus ensuring that no frequencies of the signal would be amplified when being processed based on the frequency mask. Further, the maximum damping (minimum gain) of the frequency mask could be predefined to a certain level, or, the smoothed estimated spectral density could be normalized by the unsmoothed estimated spectral density in the frequency mask.

Figure 4:
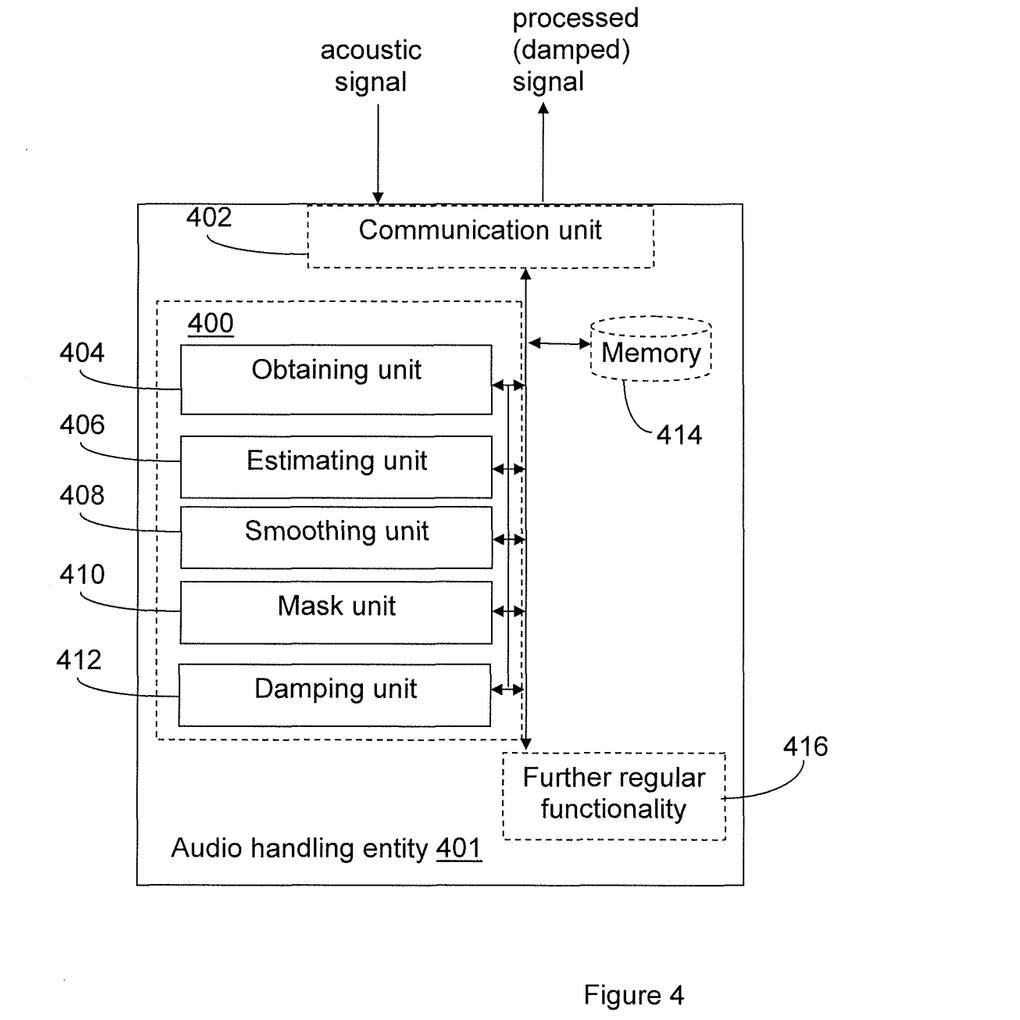
FIGS. 4-5 are block diagram illustrating a respective arrangement in an audio handling entity, according to exemplifying embodiments.

Example Arrangement, FIG. 4

Below, an example arrangement 400, adapted to enable the performance of the above described procedures related to damping of dominant frequencies in a time segment of an audio signal, will be described with reference to FIG. 4. The arrangement is illustrated as being located in an audio handling entity 401 in a communication system. The audio handling entity could be e.g. a node or terminal in a teleconference system and/or a node or terminal in a wireless or wired communication system, a node involved in audio broadcasting, or an entity or device used in music production. The arrangement 400 is further illustrated as to communicate with other entities via a communication unit 402, which may be considered to comprise conventional means for wireless and/or wired communication. The arrangement and/or audio handling entity may further comprise other regular functional units 416, and one or more storage units 414.

The arrangement 400 comprises an obtaining unit 404, which is adapted to obtain a time segment of an audio signal. The audio signal could comprise e.g. speech produced by one or more speakers taking part in a teleconference or some other type of communication session. For example, a set of consecutive samples representing a time interval of e.g. 10 ms could be obtained. The audio signal is assumed to have been captured by a microphone or similar and sampled with a sampling frequency. The audio signal may have been captured and/or sampled by the obtaining unit 404, by other functional units in the audio handling entity 401, or in another node or entity.

The arrangement further comprises an estimating unit 406, which is adapted to derive an estimate of the spectral density of the time segment. The unit 406 could be adapted to derive e.g. a periodogram, e.g. by use of a Fourier transform method, such as the FFT. Further, the arrangement comprises a smoothing unit 408, which is adapted to derive an approximation of the spectral density estimate by smoothing the estimate. The approximation should be rather "rough", i.e. not be very close to the spectral density estimate, which is typically erratic for audio signals, such as e.g. speech or music (cf. FIG. 1). The smoothing unit 408 could be adapted to achieve the smoothed spectral density estimate by use of a cepstrum thresholding algorithm, removing (in the cepstrum domain) cepstral coefficients having an absolute amplitude value below a certain threshold, or removing consecutive cepstral coefficients with an index higher than a preset threshold.

The arrangement 400 further comprises a mask unit 410, which is adapted to derive a frequency mask by inverting the approximation of the estimated spectral density. The mask unit 410 may be adapted to configure the maximum gain of the frequency mask to 1, thus ensuring that no frequencies will be amplified. The mask unit 410 may further be adapted to configure the maximum damping of the frequency mask to a certain predefined level, or to normalize the smoothed estimated spectral density by the unsmoothed estimated spectral density when deriving the frequency mask.

Further, the arrangement comprises a damping unit 412, which is adapted to damp frequencies comprised in the audio time segment, based on the frequency mask. The damping unit 412 could be adapted e.g. to multiply the frequency mask with the estimated spectral density in the frequency domain, or, to configure a FIR filter based on the frequency mask, and to use the FIR filter for filtering the audio signal time segment in the time domain.

Figure 5:
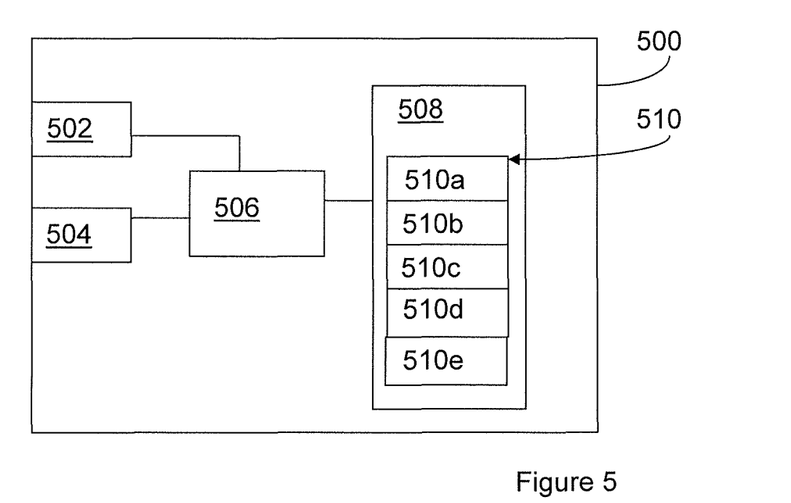

Exemplifying Alternative Arrangement, FIG. 5

FIG. 5 illustrates an alternative arrangement 500 in an audio handling entity, where a computer program 510 is carried by a computer program product 508, connected to a processor 506. The computer program product 508 comprises a computer readable medium on which the computer program 510 is stored. The computer program 510 may be configured as a computer program code structured in computer program modules. Hence in the example embodiment described, the code means in the computer program 510 comprises an obtaining module 510a for obtaining a time segment of an audio signal. The computer program further comprises an estimating module 510b for deriving an estimate of the spectral density of the time segment. The computer program 510 further comprises a smoothing module 510c for deriving an approximation of the spectral density estimate by smoothing the estimate; and a mask module 510d for deriving a frequency mask by inverting the approximation of the estimated spectral density. The computer program further comprises a damping module 510e for damping frequencies comprised in the audio time segment, based on the frequency mask.

The modules 510a-e could essentially perform the actions of the flow illustrated in FIG. 3, to emulate the arrangement in a audio handling entity illustrated in FIG. 4. In other words, when the different modules 510a-e are executed in the processing unit 506, they correspond to the respective functionality of units 404-412 of FIG. 4. For example, the computer program product may be a flash memory, a RAM (Random-access memory) ROM (Read-Only Memory) or an EEPROM (Electrically Erasable Programmable ROM), and the computer program modules 510a-e could in alternative embodiments be distributed on different computer program products in the form of memories within the arrangement 500 and/or the transceiver node. The units 502 and 504 connected to the processor represent communication units e.g. input and output. The unit 502 and the unit 504 may be arranged as an integrated entity.

Although the code means in the embodiment disclosed above in conjunction with FIG. 5 are implemented as computer program modules which when executed in the processing unit causes the arrangement and/or transceiver node to perform the actions described above in the conjunction with figures mentioned above, at least one of the code means may in alternative embodiments be implemented at least partly as hardware circuits.

It is to be noted that the choice of interacting units or modules, as well as the naming of the units are only for exemplifying purpose, and network nodes suitable to execute any of the methods described above may be configured in a plurality of alternative ways in order to be able to execute the suggested process actions.

It should also be noted that the units or modules described in this disclosure are to be regarded as logical entities and not with necessity as separate physical entities.

ABBREVIATIONS

AEC Acoustic Echo Control
DRC Dynamic Range Compression
FIR Finite length Impulse Response
FFT Fast Fourier Transform

REFERENCES

[1] Stoica, P., Sandgren, N. Smoothed Nonparametric Spectral Estimation via Cepstrum Thresholding. IEEE Sign. Proc. Mag. 2006.
[2] Stoica, P., Sandgren, N. Total Variance Reduction via Thresholding: Application to Cepstral Analysis. IEEE Trans. Sign. Proc. 2007.

The invention claimed is:

1. A method in an audio handling entity for damping of dominant frequencies in a time segment of an audio signal, the method comprising:
    obtaining a time segment of an audio signal;
    deriving an estimate of the spectral density of the time segment;
    deriving an approximation of the estimated spectral density by smoothing the estimate;
    deriving a frequency mask by inverting the approximation of the estimated spectral density, the output of the inverting producing a frequency domain signal as the frequency mask; and
    damping frequencies comprised in the audio time segment based on the frequency mask.

2. The method according to claim 1, wherein the smoothing involves deriving cepstral coefficients of the spectral density estimate, and at least one of:
    removing cepstral coefficients having an absolute amplitude value below a certain threshold; and
    removing consecutive cepstral coefficients with index higher than a preset threshold.

3. The method according to claim 1, wherein the frequency mask is configured to have a maximum gain of 1.

4. The method according to claim 1, wherein the maximum damping of the frequency mask is predefined to a certain level.

5. The method according to claim 1, wherein the frequency mask $F_p$ is defined as:

$$F_p = 1 - \lambda \frac{\tilde{\phi}_p}{\max(\tilde{\phi}_p)},$$

where $0 < \lambda < 1$, and $p = 0, \ldots, N-1$; where N is the number of samples of the audio signal time segment; and $\tilde{\Phi}_p$ is the smoothed estimated spectral density.

6. The method according to claim 1, wherein, in the frequency mask, the smoothed estimated spectral density is normalized by the unsmoothed estimated spectral density.

7. The method according to claim 1, wherein the frequency mask $F_p$ is defined as:

$$F_p = 1 - \frac{\tilde{\phi}_p}{\max(\tilde{\phi}_p)},$$

where p=0, ..., N−1; and where N is the number of samples of the audio signal time segment, $\Phi_p$ is the estimated spectral density, and $\tilde{\Phi}_p$ is the smoothed estimated spectral density.

8. The method according to claim 1, wherein the estimate of the spectral density of the signal segment is a periodogram.

9. The method according to claim 1, wherein the damping involves at least one of:
   multiplying the frequency mask with the estimated spectral density in the frequency domain; and
   configuring a FIR filter based on the frequency mask, for use on the audio signal time segment in the time domain.

10. An audio signal processing apparatus comprising a processor and memory, said memory containing instructions executable by said processor whereby said audio signal processing apparatus is operative to:
   obtain a time segment of an audio signal;
   derive an estimate of the spectral density of the time segment;
   derive an approximation of the spectral density estimate by smoothing the estimate;
   derive a frequency mask by inverting the approximation of the estimated spectral density, the output of the inverting producing a frequency domain signal as the frequency mask; and
   damp frequencies comprised in the audio time segment based on the frequency mask.

11. The audio signal processing apparatus according to claim 10, wherein the smoothing includes deriving cepstral coefficients of the spectral density estimate and removing cepstral coefficients according to a predefined rule.

12. The audio signal processing apparatus according to claim 11, wherein the predefined rule involves one of:
   removing cepstral coefficients having an absolute amplitude value below a certain threshold, and
   removing consecutive cepstral coefficients with index higher than a preset threshold.

13. The audio signal processing apparatus according to claim 10, wherein the frequency mask is configured to have a maximum gain of 1.

14. The audio signal processing apparatus of claim 10, wherein the maximum damping of the frequency mask is predefined to a certain level.

15. The audio signal processing apparatus according to claim 10, wherein, in the frequency mask, the smoothed estimated spectral density is normalized by the unsmoothed estimated spectral density.

16. The audio signal processing apparatus according to claim 10, wherein the damping involves at least one of:
   multiplying the frequency mask with the estimated spectral density in the frequency domain; and
   configuring a FIR filter based on the frequency mask, for use on the audio signal time segment in the time domain.

17. The method according to claim 1, wherein the smoothing is non-parametric.

18. The method according to claim 2, wherein the smoothed estimated spectral density $\tilde{\Phi}_p$ is defined as:

$$\tilde{\Phi}_p = \alpha \hat{\Phi}_p,$$

where $$\hat{\Phi}_p = \exp\left[\sum_{k=0}^{N-1} \hat{c}_k e^{-i\omega_p k}\right];$$

where $\omega_p$ are a sequence of Fourier grid points, where p=0, ..., N−1, where N is the number of samples of the audio signal time segment, where $\alpha$ is a normalization constant, and where the sequence $\hat{c}_k$ is the modified sequence of cepstral coefficients.

19. The method according to claim 18, wherein the normalization constant $\alpha$ is defined as:

$$\alpha = \frac{\sum_{p=0}^{N-1} \Phi_p \hat{\Phi}_p}{\sum_{p=0}^{N-1} \hat{\Phi}_p^2},$$

where $$\hat{\Phi}_p = \exp\left[\sum_{k=0}^{N-1} \hat{c}_k e^{-i\omega_p k}\right];$$

where $\omega_p$ are a sequence of Fourier grid points; where p=0, ..., N−1; where N is the number of samples of the audio signal time segment; and where the sequence $\hat{c}_k$ is the second sequence of cepstral coefficients.

20. The audio signal processing apparatus according to claim 10, wherein the smoothing is non-parametric.

21. The audio signal processing apparatus according to claim 12, wherein the smoothed estimated spectral density $\tilde{\Phi}_p$ is defined as:

$$\tilde{\Phi}_p = \alpha \hat{\Phi}_p,$$

where $$\hat{\Phi}_p = \exp\left[\sum_{k=0}^{N-1} \hat{c}_k e^{-i\omega_p k}\right];$$

where $\omega_p$ are a sequence of Fourier grid points; where p=0, ..., N−1; where N is the number of samples of the audio signal time segment; where $\alpha$ is a normalization constant; and where the sequence $\hat{c}_k$ is the modified sequence of cepstral coefficients.

22. The audio signal processing apparatus according to claim 21, wherein the normalization constant $\alpha$ is defined as:

$$\alpha = \frac{\sum_{p=0}^{N-1} \Phi_p \hat{\Phi}_p}{\sum_{p=0}^{N-1} \hat{\Phi}_p^2},$$

where

-continued $$\hat{\Phi}_p = \exp\left[\sum_{k=0}^{N-1} \hat{c}_k e^{-i\omega_p k}\right];$$

where $\omega_p$ are a sequence of Fourier grid points; where p= 0, . . . , N−1; where N is the number of samples of the audio signal time segment; and where the sequence $\hat{c}_k$ is the second sequence of cepstral coefficients.

23. The method of claim 1, wherein the inverting the approximation of the estimated spectral density includes the function of 1 divided by the approximation of the estimated spectral density.

\* \* \* \* \*

UNITED STATES PATENT AND TRADEMARK OFFICE
CERTIFICATE OF CORRECTION

PATENT NO.        : 9,065,409 B2
APPLICATION NO.   : 13/071711
DATED             : June 23, 2015
INVENTOR(S)       : Sandgren It is certified that error appears in the above-identified patent and that said Letters Patent is hereby corrected as shown below:

Title Page

On Page 2, in Item (56), under "OTHER PUBLICATIONS", in Column 2, Line 5, delete "Stoica, P., et al." and insert -- Stoica, P. et al., --, therefor.

Specification

In Column 5, Line 34, delete "Procedure" and insert -- Procedure, --, therefor.

In Column 5, Line 54, delete "Such as" and insert -- such as --, therefor.

In Column 7, Line 40, delete "a audio" and insert -- an audio --, therefor.

Claims

In Column 9, Line 5, Claim 7, delete "$F_p = 1 - \frac{\tilde{\phi}_p}{\max(\phi_p)},$" and insert -- $F_p = 1 - \frac{\tilde{\phi}_p}{\max(\phi_p)},$ --, therefor.

Signed and Sealed this
First Day of December, 2015

Michelle K. Lee
*Director of the United States Patent and Trademark Office*